(12) United States Patent
Duvvury

(10) Patent No.: US 6,249,413 B1
(45) Date of Patent: Jun. 19, 2001

(54) SEMICONDUCTOR ESD PROTECTION CIRCUIT

(75) Inventor: Charvaka Duvvury, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/314,982

(22) Filed: May 20, 1999

Related U.S. Application Data

(63) Continuation of application No. 08/795,435, filed on Feb. 5, 1997, now Pat. No. 5,940,258.
(60) Provisional application No. 60/012,482, filed on Feb. 29, 1996.

(51) Int. Cl.[7] .................................................. H02H 3/22
(52) U.S. Cl. ............................ 361/111; 361/56; 361/91.5
(58) Field of Search ........................... 361/56, 111, 91.1, 361/91.2, 91.5; 257/355

(56) References Cited

U.S. PATENT DOCUMENTS

| | | | |
|---|---|---|---|
| 4,855,620 | * | 8/1989 | Duvvury et al. ..................... 307/448 |
| 5,290,724 | * | 3/1994 | Leach ....................................... 437/51 |
| 5,528,188 | * | 6/1996 | Au et al. ................................ 327/310 |
| 5,940,258 | * | 8/1999 | Duvvury ................................. 361/56 |

* cited by examiner

*Primary Examiner*—Michael J. Sherry
(74) *Attorney, Agent, or Firm*—Jacqueline J. Garner; W. James Brady, III; Frederick J. Telecky, Jr.

(57) ABSTRACT

Protection circuitry (10) for protecting an integrated circuit from an ESD pulse is provided. The protection circuitry (10) includes discharge circuitry (14) on a substrate (11) that discharges an ESD pulse to the integrated circuit to ground (18). The protection circuitry (10) also includes a substrate bias generator (25) that uses a portion of the ESD pulse's energy to bias the substrate (11) of the discharge circuitry (14).

3 Claims, 1 Drawing Sheet

SEMICONDUCTOR ESD PROTECTION CIRCUIT

This application is a continuation of U.S. application Ser. No. 08/795,435, filed Feb. 5, 1997, now U.S. Pat. No. 5,940,258, which claims priority from provisional application No. 60/012,482, filed Feb. 29, 1996.

TECHNICAL FIELD OF THE INVENTION

This invention relates in general to the field of semiconductor devices, and more particularly, to an improved semiconductor ESD protection circuit.

BACKGROUND OF THE INVENTION

Integrated circuits (ICs) may be severely damaged by electrostatic discharge (ESD) phenomena. An IC may be exposed to ESD from many sources. The major source of ESD exposure to ICs is from the human body, and is known as the Human Body Model (HBM) ESD source. A charge of about 0.6 $\mu C$ can be induced on a body capacitance of 150 pF, leading to electrostatic potentials of 4 kV or greater. Any contact by a charged human body with a grounded object, such as the pin of an IC, can result in a discharge for about 100 nS with peak currents of several amperes to the IC.

A second source of ESD is from metallic objects, and is known as the machine model (MM) ESD source. The MM ESD source is characterized by a greater capacitance and lower internal resistance than the HBM ESD source. The MM ESD model can result in ESD transients with significantly higher rise times than the HBM ESD source.

A third ESD model is the charged device model (CDM). Unlike the HBM ESD source and the MM ESD source, the CDM ESD source includes situations where the IC itself becomes charged and discharges to ground. Thus, the ESD discharge current flows in the opposite direction in the IC than that of the HBM ESD source and the MM ESD source. CDM pulses also have very fast rise times compared to the HBM ESD source.

The most common protection schemes used in metal-oxide semiconductor (MOS) ICs rely on the parasitic bipolar transistor associated with a nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism found in then MOS protection device operating as a parasitic bipolar transistor in snapback conditions is the onset of second breakdown. Second breakdown is a phenomenon that induces thermal runaway in the device wherever the reduction of the impact ionization current is offset by the thermal generation of carriers. Second breakdown is initiated in a device under stress as a result of self heating. The peak nMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger metal oxide semiconductor (MOS) transistor that is used to conduct an ESD discharge to ground. Nevertheless, substrate biasing can cause the threshold voltages for devices to change from their nominal values, which may affect device operation. In addition, substrate biasing under steady-state conditions causes heat generation and increases power losses. Thus, although substrate biasing has the benefit of increasing the response of ESD protection of multi-finger MOS transistors, the additional problems caused by substrate biasing may limit its effectiveness.

SUMMARY OF THE INVENTION

Therefore, a need has arisen for improved ESD protection circuitry. In particular, a need has arisen for a circuit for biasing the substrate of ESD protection circuitry that does not result in the problems of heating, power losses, and device malfunction associated with existing substrate biasing circuits.

One aspect of the present invention provides protection circuitry that protects an integrated circuit from an ESD pulse. The protection circuitry includes discharge circuitry on a substrate that discharges an ESD pulse to the integrated circuit to ground. The protection circuitry also includes a substrate bias generator that uses a portion of the ESD pulse's energy to bias the substrate of the discharge circuitry.

Another aspect of the present invention provides a method for protecting an integrated circuit from an ESD pulse. The method includes receiving the ESD pulse at discharge circuitry on a substrate at the input of the integrated circuit. The method further includes diverting a portion of the ESD pulse to a substrate bias generator and biasing the substrate of the protection circuitry with the portion of the ESD pulse for the duration of the ESD pulse.

Yet another aspect of the present invention provides protection circuitry that protects an integrated circuit from an ESD pulse. The protection circuitry includes discharge circuitry on a substrate having an input, a gate, and a ground node and the discharge circuitry conducts the ESD pulse from the input to ground. The protection circuitry also includes a substrate bias generator that uses a portion of the ESD pulse's energy to bias the substrate of the discharge circuitry. The substrate bias generator includes a resistor that generates a voltage from the portion of the ESD pulse's energy and a guard ring coupled to the resistor that provides the voltage to the discharge circuitry's substrate.

The present invention provides several technical advantages. One important technical advantage of the present invention is that it provides protection to the devices on an IC from various ESD sources. The ESD protection circuitry of the present invention is effective to protect circuitry on the IC from the HBM, MM, and CDM ESD sources.

Another technical advantage of the present invention is that it provides substrate biasing of the ESD protection circuitry only during an ESD event. Therefore, the drawbacks associated with prior substrate biasing schemes are not experienced with the present invention.

Another important technical advantage of the present invention is that energy for biasing the substrate of the ESD protection circuitry is provided by the ESD pulse. This scheme eliminates the need to supply an additional voltage source to the ESD protection circuitry.

Yet another technical advantage of the present inventive ESD protection scheme is that it may be implemented using standard semiconductor processing techniques. The present ESD protection circuitry, therefore, does not add significant processing time or expense to the IC.

BRIEF DESCRIPTION OF THE DRAWINGS

For a more complete understanding of the present invention and advantages thereof, reference is now made to the following description taken in conjunction with the accompanying drawings, in which like reference numbers indicate like features and wherein.

DETAILED DESCRIPTION OF THE INVENTION

Preferred embodiments of the present invention are illustrated in the Figures, like numerals being used to refer to like and corresponding parts of the various drawings.

Figure 1:
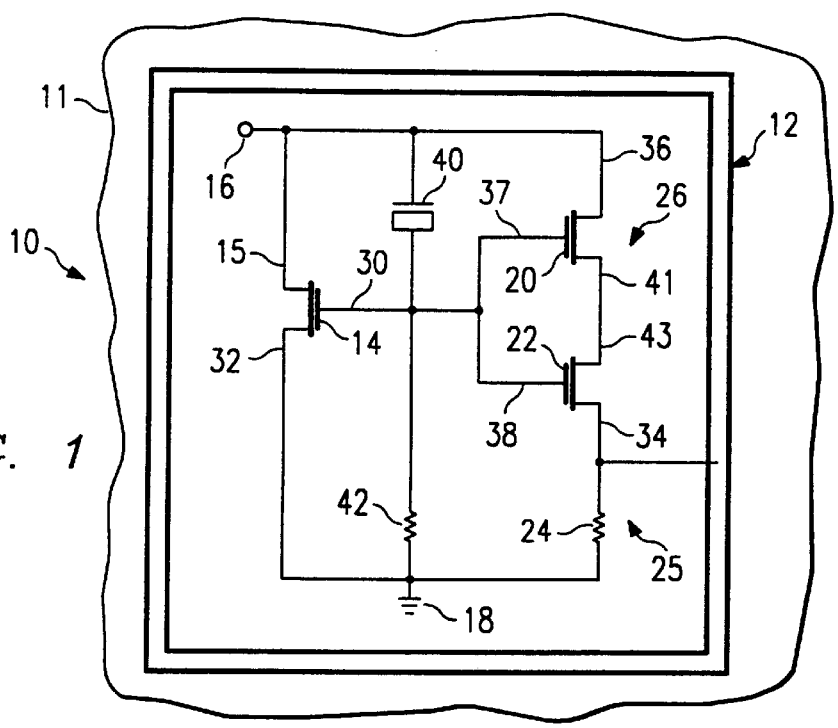
FIG. 1 is ESD protection circuitry having a guard ring substrate biasing scheme embodying concepts of the present invention.

FIG. 1 is a drawing of ESD protection circuitry 10 having a guard ring substrate biasing scheme embodying concepts of the present invention. ESD protection circuitry 10 is included in an IC in addition to other devices in the IC. For example, ESD protection circuitry 10 may be used in connection with processors and other high performance devices. ESD protection circuitry 10 is an integral part of an IC and is typically used at each input pin to the IC in order to discharge any electrical transients received at the IC before they enter the IC and cause damage to ESD sensitive components.

ESD protection circuitry 10 is fabricated on silicon substrate 11. ESD protection circuitry 10 includes guard ring 12, discharge device 14, input 16, voltage ground 18, transistors 20 and 22, and resistor 24 on substrate 11. Guard ring 12 and resistor 24 form substrate bias generator 25. Discharge device 14 of ESD protective circuity 10 as shown in FIG. 1 is a multi-finger device, such as a multi-finger MOS transistor.

Transistors 20 and 22 provide power source 26 for substrate bias generator 25 and conduct a portion of an ESD pulse received at input 16 to resistor 24. The voltage drop across resistor 24 is impressed on guard ring 12, which biases substrate 11 of discharge device 14. Biasing substrate 11 allows all the fingers of discharge device 14 to turn on as parasitic bipolar transistors and to more effectively discharge the ESD pulse received at input 16 to ground 18 thereby preventing the ESD pulse from reaching the other circuitry on substrate 11.

Guard ring 12 of ESD protection circuitry 10 is formed by, for example, implanting a ring of P+ semiconductor material into substrate 11. Guard ring 12 is used in ESD protection circuitry 10 to bias substrate 11 when ESD protection circuitry 10 is discharging an ESD pulse to ground.

As shown in FIG. 1, discharge device 14 of ESD protection circuitry 10 is a multi-finger MOS transistor. See FIG. 2 for a topical view of this multi-finger structure. A multi-finger MOS transistor is formed from a large number of parallel MOS transistors having a common gate, common drain, and common source connection. Discharge device 14 consists of drain 16 (also the input to circuitry 10), gate 30, and source 32. Discharge device 14 operates in a normally off-state, such that signals applied to drain 16 will not be conducted to ground.

Discharge device 14 may contain silicide cladding, such as titanium silicide, on its contact surfaces to improve its switching speed by decreasing the resistor-capacitor (RC) time constant delay associated with polysilicon interconnects at the contact surfaces. This silicide cladding also results in lower resistance between the drain and the gate in device 14.

When an ESD pulse is applied at drain 16, discharge device 14 undergoes avalanche breakdown into parasitic bipolar transistor mode from the input to the output at a predetermined voltage level. Following avalanche breakdown of discharge device 14, the ESD charge is conducted to ground 18. Because discharge device 14 is a multi-finger MOS transistor with silicided contacts, current crowding through less than all of the total number of fingers may occur. This current crowding may result in overheating and failure of discharge device 14.

The present semiconductor ESD protection circuitry corrects these potential problems by biasing the substrate of discharge device 14 so that all of its fingers are turned on and so that the ESD pulse at device 14 can be conducted to ground as previously described. By biasing substrate 11 at an appropriate voltage level, e.g., 0.6 V, using resistor 24 and guard ring 12, the breakdown voltage required for all the fingers of the multi-finger MOS transistor of discharge device 14 to turn on will decrease. With all the fingers in device 14 on, current crowding in device 14 is eliminated. Thus, substrate biasing can be used to ensure that all fingers of discharge device 14 are conducting and to prevent failure of discharge device 14 from second breakdown. This allows ESD protection circuitry 10 to discharge an ESD pulse without experiencing the problems with prior ESD protection schemes.

In ESD protection circuitry 10 in FIG. 1, guard ring 12 couples to resistor 24 and to source 34 of transistor 22. Biasing of substrate 11 in FIG. 1 is achieved in ESD protection circuitry 10 by diverting a portion of the ESD charge received at input 16 through transistor 20, transistor 22, and resistor 24 to ground 18. Thus, when a portion of the ESD current is conducted through transistor 20, transistor 22, and resistor 24, the voltage drop across resistor 24 will be imposed on guard ring 12. This in turn, results in biasing of local substrate 11 contained within guard ring 12 when the ESD pulse is being discharged. At all other times, resistor 24 keeps guard ring 12 at ground potential.

Gate 37 of transistor 20 and gate 38 of transistor 22 couple to gate 30 of discharge device 14. Gate 30 of discharge device 14 couples to drain 16 through capacitor 40. Source 41 of transistor 20 couples to drain 43 of transistor 22. Capacitor 40 may be formed by shorting the drain and source of a MOS transistor and using the gate oxide layer as the capacitive dielectric. In addition, capacitor 40 may be a single capacitor, or may be multiple capacitors distributed within the individual fingers of discharge device 14.

Resistor 42 couples between the gates of transistors 14, 20 and 22 and ground 18. Resistor 42 is typically an n-well resistor that is used in conjunction with capacitor 40 to discharge the voltage at gate 30 of discharge device 14, and gates 37, and 38 of transistors 20 and 22, respectively, and prevents current leakage in transistors 14, 20, and 22. Resistor 42 could also be built from polysilicon material. Capacitor 40 in conjunction with resistor 42 allows the design of a suitable coupling level on gate 30 of transistor 14, as well as on gates 37 and 38 of transistors 20 and 22, respectively. The oxide capacitances of transistors 14, 20, and 22 and resistor 42 determine the resistive capactive (RC) time constant, for example on the order of approximately 15 to 100 nS, for the circuit and is designed to be optimum for an ESD pulse and also prevent current leakage during normal operation. Resistor 24 in bias generator 25 is typically a poly-resistor that is sized such that the voltage impressed on guard ring 12 does not exceed a value that would cause damage to the components of ESD protection circuitry 10 when an ESD pulse is received at input 16.

In operation, when an ESD pulse with a large dV/dt is applied to the input node of ESD protection circuitry 10 at drain 16, the large dV/dt of the ESD pulse causes current to flow through capacitor 40, in accordance with the relationship:

$$I = C \times \frac{dV}{dt}$$

This current causes the voltage at gates 30, 37, and 38 to increase rapidly, turning on discharge device 14 and transistors 20 and 22. As previously mentioned, the silicide coating of the multi-finger transistor of discharge device 14 may prevent all the fingers in the transistor from simultaneously and instantly turning on. Transistors 20 and 22 are single transistors and are fully turned on by the voltage at gates 37 and 38 and conduct current from input 16 to ground 18 through resistor 24.

Guard ring 12 couples to resistor 24 and source 34 of transistor 22 and rises to a predetermined maximum voltage as current conducts to ground through resistor 24. This voltage rise subsequently causes substrate 11 of ESD protection circuitry 10 to also rise, which in turn allows all of the multi-finger MOS transistors of discharge device 14 to turn on as a bipolar device. Discharge device 14 then discharges the ESD pulse to ground 18 and does not suffer damage from current crowding in less than the total number of fingers in discharge device 14.

ESD protection circuitry 10 thus has the advantages of generating a substrate bias simultaneously with the occurrence of an ESD pulse and uses the energy of the ESD pulse to generate the substrate bias. The substrate bias then dissipates along with the ESD pulse so that the other devices on substrate 11 are not adversely affected. These features improve the effectiveness of discharge device 14 and also help to prevent damage to discharge device 14.

Figure 2:
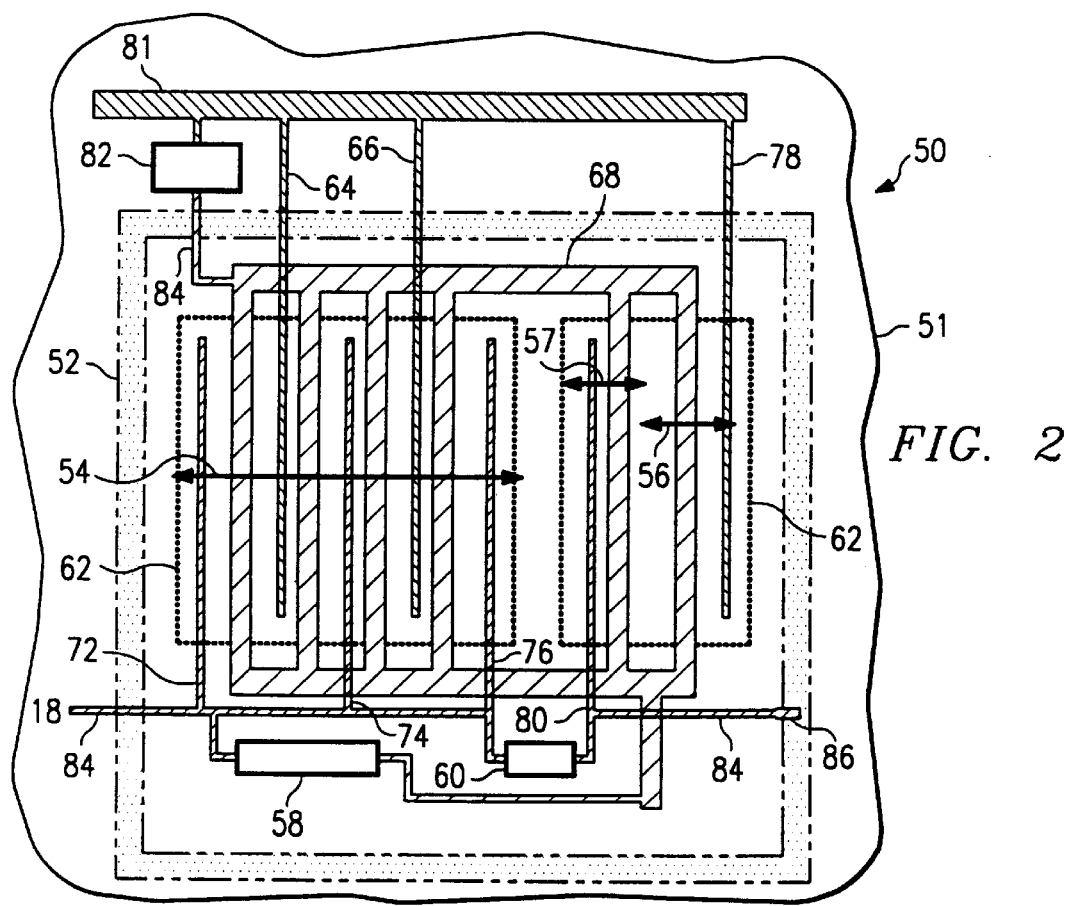
FIG. 2 illustrates a top-plan view of an IC embodying concepts of the present invention.

FIG. 2 is a top-plan view drawing of IC 50 embodying concepts of the present invention. IC 50 includes substrate 51, guard ring 52, discharge device 54, transistors 56 and 57, and resistors 58 and 60. IC 50 embodies concepts of ESD protection circuitry 10 of FIG. 1. Discharge device 54 is a multi-finger device that includes drain fingers formed by n-type diffusion material 62 that couples to conductive material fingers 64 and 66, gate fingers formed by polysilicon material 68, and source fingers formed by n-type diffusion material 62 that couples to conductive material fingers 72, 74, and 76. Also, conductive metal finger 78 extends to transistor 56, conductive metal finger 80 extends to transistor 57, and polysilicon material 68 extends into both transistors 56 and 57. A silicide coating on all contact surfaces improves the electrical contact between the conductive material fingers and the drain and source regions.

N-type diffusion material 62 does not extend significantly underneath polysilicon gate material 68. In addition, an oxide dielectric layer (not explicitly shown) extends underneath polysilicon gate material 68. Pad 81 couples to drain fingers in n-type diffusion material 62 by electrically conductive material fingers 64, 66, and 78. Capacitor 82 in the embodiment of the present invention shown in FIG. 2 is a single capacitor, as opposed to the previously described distributed capacitor within the fingers of discharge device 14 of FIG. 1.

Transistors 56 and 57 include drain fingers formed by n-type diffusion material 62, gate fingers formed by polysilicon material 68, and source fingers formed by n-type diffusion material 62. N-type diffusion material 62 does not extend significantly underneath polysilicon gate material 68. In addition, an oxide dielectric layer (not explicitly shown) extends underneath polysilicon gate material 68. As shown, source finger 80 of transistor 57 couples to resistor 60 and guard ring 52 by electrically conductive material 84. Electrically conductive material 84 contacts guard ring 52 electrically only at contact 86. At all other locations where electrically conductive material 84 crosses guard ring 52 it does not make electrical contact with guard ring 52.

The gates of transistors 54, 56, and 57 couple to capacitor 82 and resistor 58 through polysilicon material 68 and electrically conductive material 84. Resistor 58 couples to ground 18 via electrically conductive material 84. The source of transistor 56 coextends with the drain of transistor 57 as they are comprised of the same layer of n-type diffusion material 62. Electrically conductive material 84 including electrically conductive metal fingers 72, 74, 76, and 80, makes contact with n-type diffusion material 62 at all places where the two materials overlap. A silicide coating, such as titanium silicide, covers the surface of n-type diffusion material 62 to increase its selective speed by decreasing the RC time constant associated with the contact to electrically conductive material 84.

In operation, when an ESD pulse with a large dV/dt reaches the input node of IC 50 at pad 81, the large dV/dt conducts current to capacitor 82 and n-type diffusion material 62 through electrically conductive materials 64, 66, and 78. The ESD pulse causes capacitor 82 to conduct current to polysilicon material 68, which forms the gates of transistors 54, 56, and 57. The ESD pulse conducts to the drains of multi-finger transistor 54 by conductive material fingers 64 and 66, and to the drain of transistor 56 in n-type diffusion material 62 by conductive material finger 78. The silicide coating on the surface of n-type diffusion material 62 may cause the ESD pulse current to distribute such that not all fingers of transistor 54 turn on as parasitic bipolar transistors. Transistors 56 and 57 are both single finger devices and turn fully on as a result of the ESD pulse to pad 81. Furthermore, transistors 56 and 57, being in series, have a higher breakdown voltage and therefore do not participate in a high current ESD event. That is, they allow transistor 54 to be the main protection device. Transistor 54 is made large enough to obtain the desired protection level.

To prevent current crowding in device 54, substrate 51 is appropriately biased with energy from the ESD pulse as previously described. Guard ring 52 couples to resistor 60 and n-type diffusion material 62 that forms the source node of transistor 57 by electrically conductive material 84. Guard ring 52 rises to a predetermined maximum voltage as the ESD current conducted through transistors 56 and 57 conducts to ground 18. The voltage on guard ring 52 causes substrate 51 of ESD protection circuitry 50 to also rise. This, in turn, causes all fingers of transistor 54 to turn on as a parasitic bipolar transistor thereby preventing current crowding in transistor 54 and allows transistor 54 to discharge the ESD pulse to ground without suffering second breakdown from current stress caused by the operation of less than the total number of fingers in transistor 54.

In operation, the ESD protection circuitry of the present invention diverts a portion of an ESD pulse to ground through a substrate biasing circuit. This substrate biasing circuit improves the response of a multi-fingered MOS transistor used to discharge the ESD pulse by ensuring that all fingers of the multi-fingered MOS transistor turn fully on. The ESD protection circuitry thus helps prevent failure in the multi-fingered MOS transistor that may result if all fingers in the multi-fingered MOS transistor fail to turn on during the ESD pulse.

The present invention provides ESD protection circuitry that uses substrate biasing during only an ESD event. Once the ESD event passes the substrate biasing is removed. The drawbacks associated with other substrate biasing schemes are therefore not experienced with the present invention. Because the ESD pulse provides energy for biasing the substrate, an additional power source for the ESD protection circuitry is not needed.

Although the present invention has been described in detail, it should be understood that various changes, substitutions, and alterations can be made hereto without departing from the spirit and scope of the invention as defined by the appended claims.

What is claimed is:

1. An integrated circuit comprising a protection circuit that comprises:
   discharge circuitry on a substrate operable to discharge an ESD pulse to the integrated circuit;
   a substrate bias generator comprising a guard ring in said substrate around said discharge circuitry, said guard ring being resistively connected to ground; and
   a power source operable to provide a portion of the ESD pulse to the substrate bias generator, wherein the power source comprises at least one transistor coupled between an input to the integrated circuit and the guard ring.

2. The integrated circuit of claim 1, wherein the discharge circuitry comprises a discharge transistor having a drain connected to said input of the integrated circuit, a source connected directly to ground and a gate connected to a gate of the at least one transistor of said power source.

3. The integrated circuit of claim 2, wherein said gate of the discharge transistor is also connected through a capacitor to the input of the integrated circuit and through a resistor to ground.

* * * * *